(12) United States Patent
Kaneko et al.

(10) Patent No.: US 8,378,230 B2
(45) Date of Patent: Feb. 19, 2013

(54) PRINTED WIRING BOARD AND METHOD FOR MANUFACTURING THE SAME

(75) Inventors: Masahiro Kaneko, Ogaki (JP); Daiki Komatsu, Ogaki (JP); Satoru Kose, Ogaki (JP); Hirokazu Higashi, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 159 days.

(21) Appl. No.: 12/770,820

(22) Filed: Apr. 30, 2010

(65) Prior Publication Data
US 2011/0067913 A1 Mar. 24, 2011

Related U.S. Application Data

(60) Provisional application No. 61/228,013, filed on Jul. 23, 2009.

(51) Int. Cl.
*H05K 1/11* (2006.01)
(52) U.S. Cl. ........................ 174/266; 174/262
(58) Field of Classification Search .......... 174/250–266; 361/792–795; 257/777, E23.169, E21.502; 29/847, 829
See application file for complete search history.

(56) References Cited

U.S. PATENT DOCUMENTS

| | | | | |
|---|---|---|---|---|
| 5,936,848 | A * | 8/1999 | Mehr et al. | 361/777 |
| 7,208,348 | B2 * | 4/2007 | Geng et al. | 438/125 |
| 2005/0251997 | A1 * | 11/2005 | Homg et al. | 29/830 |
| 2006/0202344 | A1 * | 9/2006 | Takada et al. | 257/758 |
| 2009/0298228 | A1 * | 12/2009 | Sato et al. | 438/108 |

FOREIGN PATENT DOCUMENTS

JP 2006-019433 1/2006

* cited by examiner

*Primary Examiner* — Yuriy Semenenko
(74) *Attorney, Agent, or Firm* — Oblon, Spivak, McClelland, Maier & Neustadt, L.L.P.

(57) ABSTRACT

A printed wiring board includes an interlayer resin insulation layer having the first surface, the second surface on the opposite side of the first surface, and a penetrating hole for a via conductor, a conductive circuit formed on the first surface of the interlayer resin insulation layer, a via conductor formed in the penetrating hole and connected to the conductive circuit on the first surface of the interlayer resin insulation layer, and a surface-treatment coating formed on the surface of the via conductor exposed from the second surface of the interlayer resin insulation layer through the penetrating hole. The via conductor is made of a first conductive layer formed on the side wall of the penetrating hole and a plated-metal filling the penetrating hole. The surface of the via conductor is recessed from the second surface of the interlayer resin insulation layer.

9 Claims, 11 Drawing Sheets

FIG. 1
(A)
(B)
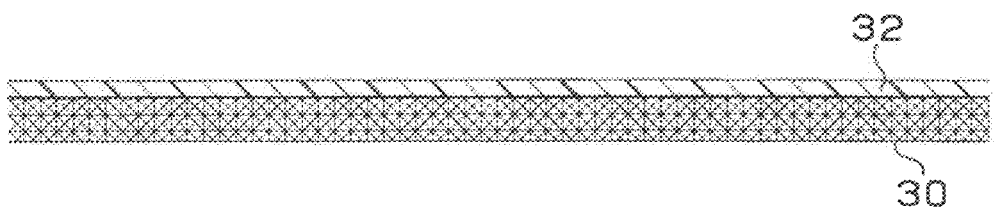
(C)
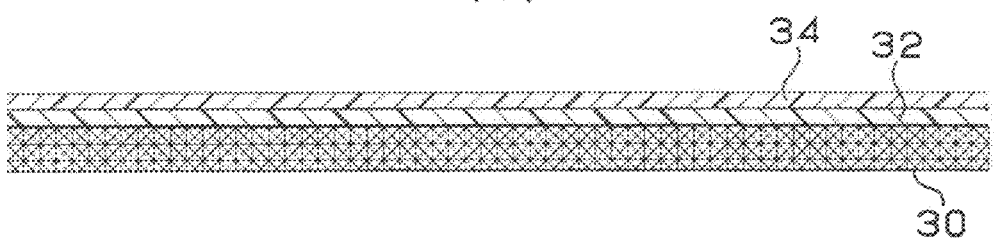
(D)
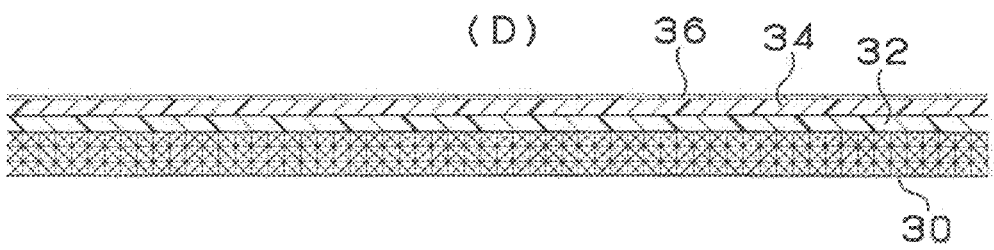

FIG. 9
(A)
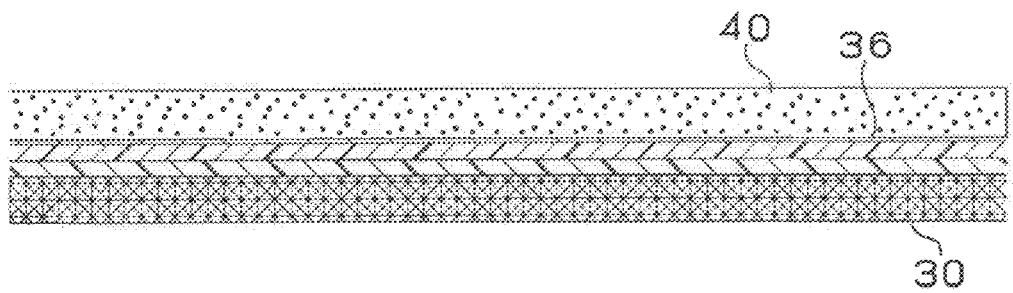
(B)
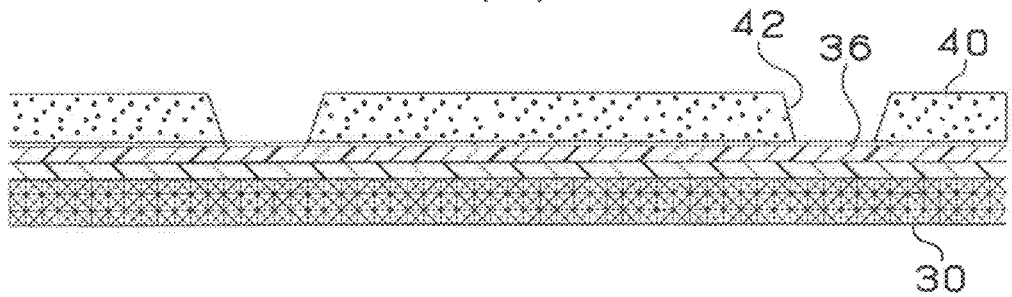
(C)
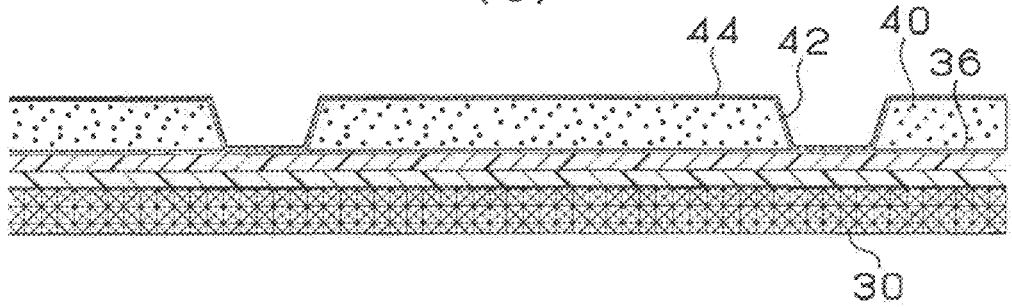

PRINTED WIRING BOARD AND METHOD FOR MANUFACTURING THE SAME

CROSS-REFERENCE TO RELATED APPLICATIONS

The present application claims the benefits of priority to U.S. Application No. 61/228,013, filed Jul. 23, 2009. The contents of that application are incorporated herein by reference in their entirety.

BACKGROUND OF THE INVENTION

1. Field of the Invention

The present invention relates to a super-thin printed wiring board which can be used preferably for an SSD or the like to mount multiple flash memories, and to a method for manufacturing such a printed wiring board.

2. Discussion of the Background

With the aim of providing a thin-type wiring board, for example, a manufacturing method is disclosed in Japanese Laid-Open Patent Publication 2006-19433. In the manufacturing method, an insulation layer is formed on a silicon substrate and a via conductor is formed in the insulation layer. After that, a wiring layer is formed on the via conductor, and a semiconductor element is mounted on the wiring layer and encapsulated with resin. Then, the silicon substrate is removed and a wiring board is obtained. The contents of this publication are incorporated herein by reference in their entirety.

SUMMARY OF THE INVENTION

According to one aspect of the present invention, a printed wiring board includes an interlayer resin insulation layer having the first surface, the second surface on the opposite side of the first surface, and a penetrating hole for a via conductor, a conductive circuit formed on the first surface of the interlayer resin insulation layer, a via conductor formed in the penetrating hole and connected to the conductive circuit on the first surface of the interlayer resin insulation layer, and a surface-treatment coating formed on the surface of the via conductor exposed from the second surface of the interlayer resin insulation layer through the penetrating hole. The via conductor is made of a first conductive layer formed on the side wall of the penetrating hole and a plated-metal filling the penetrating hole. The surface of the via conductor is recessed from the second surface of the interlayer resin insulation layer.

According to another aspect of the present invention, a method for manufacturing a printed wiring board includes forming a removable layer on a support substrate, forming an interlayer resin insulation layer on the removable layer, forming a penetrating hole in the interlayer resin insulation layer, forming a first conductive layer on the interlayer resin insulation layer, forming a conductive circuit on the interlayer resin insulation layer, forming a via conductor in the penetrating hole, removing the support substrate from the interlayer resin insulation layer by using the removable layer, removing a portion of the first conductive layer exposed through the penetrating hole by the removing of the removing layer and the support substrate, and forming a surface-treatment coating on a portion of the via conductor exposed through the penetrating hole in the interlayer resin insulation layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 are views of the steps for manufacturing a printed wiring board according to the first embodiment of the present invention;

FIG. 9 are views of the steps for manufacturing a printed wiring board according to the second embodiment of the present invention;

DETAILED DESCRIPTION OF THE EMBODIMENTS

Figure 2:
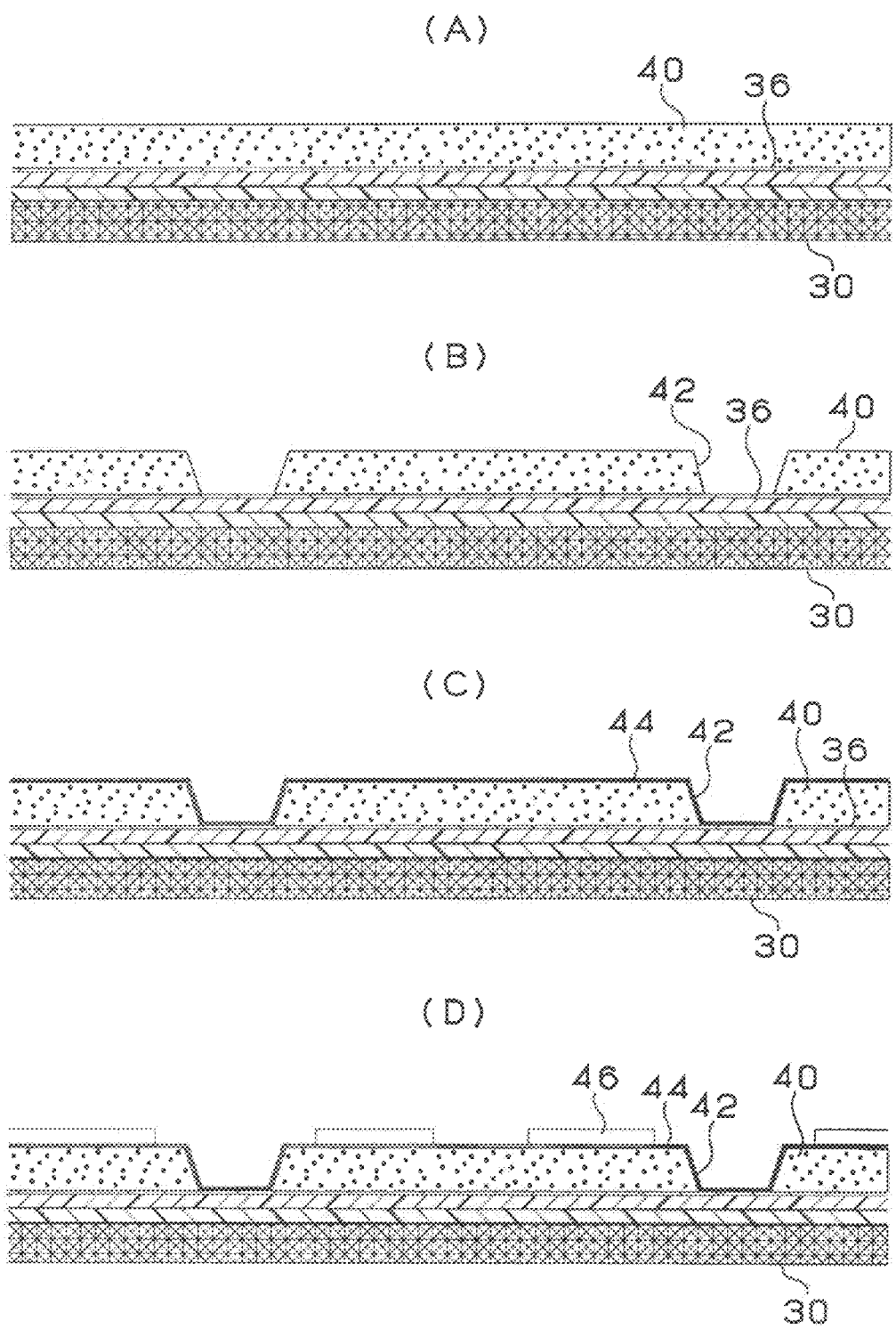
FIG. 2 are views of the steps for manufacturing a printed wiring board according to the first embodiment.

The embodiments will now be described with reference to the accompanying drawings, wherein like reference numerals designate corresponding or identical elements throughout the various drawings.

First Embodiment

A printed wiring board according to the first embodiment of the present invention and a method for manufacturing such a wiring board are described with reference to FIGS. 1-7.

Figure 6:
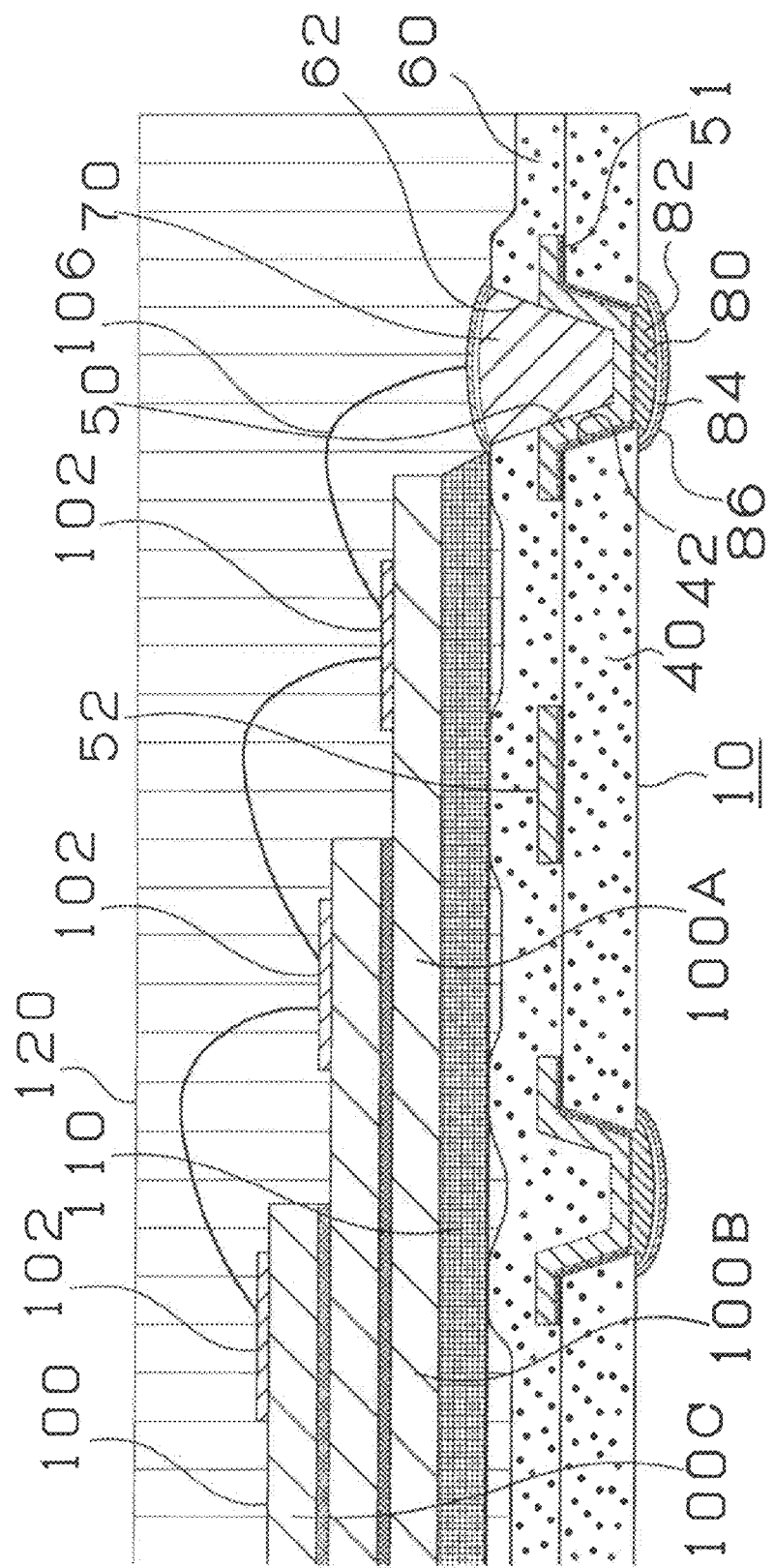
FIG. 6 is a cross-sectional view showing a printed wiring board of the first embodiment.
Figure 7:
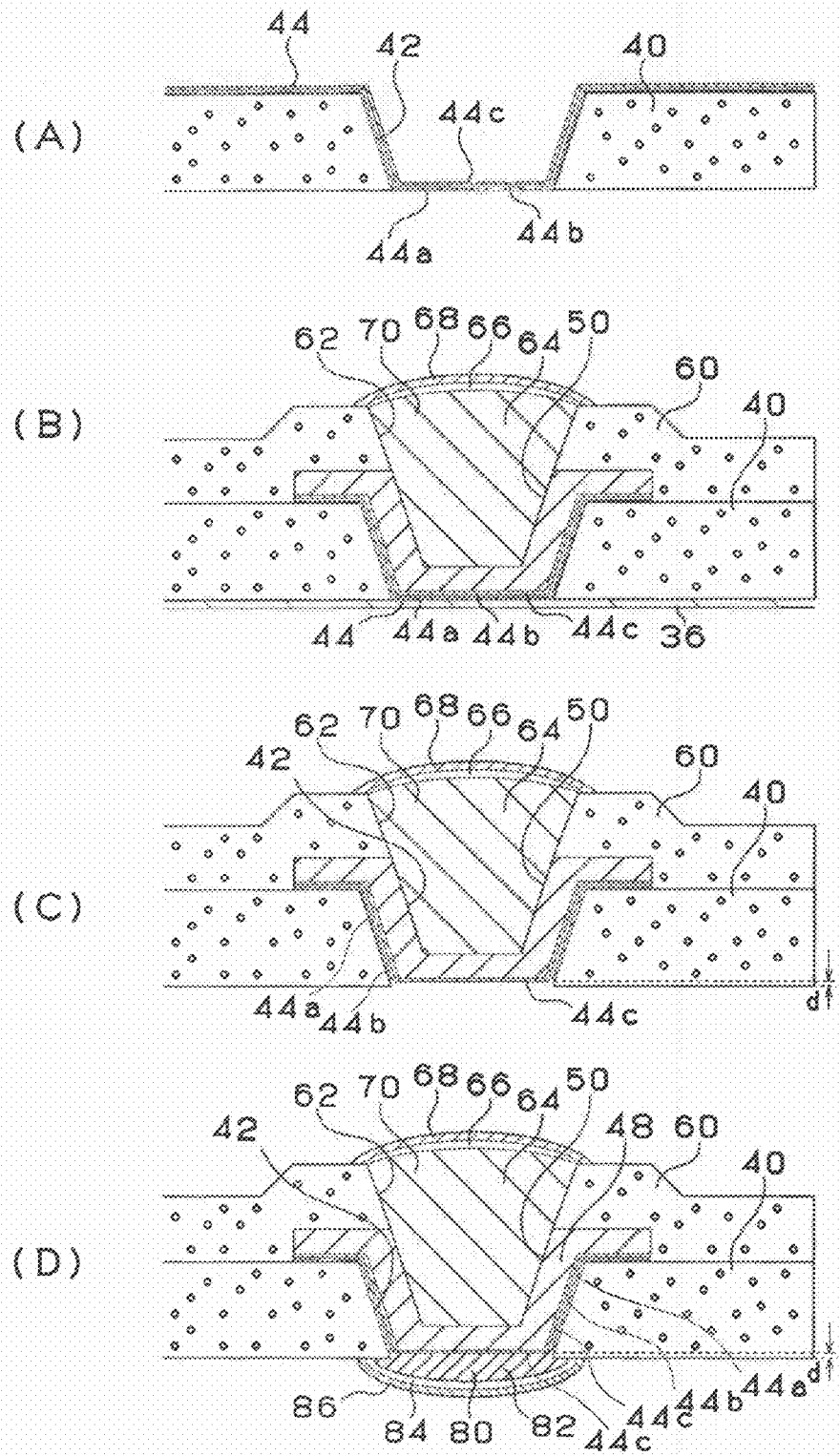
FIG. 7 are views of the steps for manufacturing a printed wiring board according to the first embodiment, showing a magnified via conductor and bump.

FIG. 6 is a cross-sectional view showing part of printed wiring board 10. In printed wiring board 10, memory laminate 100 made by laminating multiple sheets of memories 100A, 100B and 100C is mounted. Memory laminate 100 is fixed to printed wiring board 10 by means of adhesive layer 110. The memories of memory laminate 100 are connected to each other by wires 106, for example. The memories may also be connected to each other by wiring formed by inkjet.

Printed wiring board 10 has a double-layer structure of first interlayer resin insulation layer 40 and second interlayer resin insulation layer 60. In opening 42 formed in first interlayer resin insulation layer 40, via conductor 50 is formed. On first interlayer resin insulation layer, conductive circuit 52 and via land 51 are arranged. Opening 62 is formed in second interlayer resin insulation layer 60, and surface-treatment coating 70 is formed in opening 62. Printed wiring board 10 and memory laminate 100 are connected by wire 106 spanning between surface-treatment coating 70 of printed wiring board 10 and pad 102 of memory laminate 100. On the lower-surface side (first-surface side) of via conductor 50, surface-treatment coating 80 for external connection is formed to have a structure that enables wire bonding. Memory laminate 100 is encapsulated with molding resin 120.

FIG. 7D shows a magnified view of the area surrounding via conductor 50 in FIG. 6. Surface-treatment coating 70 on via conductor 50 is formed with Ni-plated layer 64 which is filled in opening 62 in second interlayer resin insulation layer 60, Pd film 66 on Ni-plated layer 64 and Au film 68 on Pd film 66. Au film 68 is coated with the purpose of preventing corrosion of the conductive circuit and of allowing easy bonding connection of wire 106 made of a gold wire.

On the side wall of opening 42 in first interlayer resin insulation layer 40, TiN-sputtered film (44a) (first conductive layer), Ti-sputtered film (44b) (first conductive layer) and Cu-sputtered film (44c) (second conductive layer) are formed in that order. Namely, via conductor 50 is formed with TiN-sputtered film (44a), Ti-sputtered film (44b), Cu-sputtered film (44c) and electrolytic copper-plated film 48 formed on the inner side of Cu-sputtered film (44c). TiN-sputtered film (44a) and Ti-sputtered film (44b) are removed from the bottom-surface side (first-surface side) of via conductor 50, and surface-treatment coating 80 is formed on the surface of Cu-sputtered film (44c). Surface-treatment coating 80 is formed with Ni-plated layer 82 formed on the first surface of via conductor 50, Pd film 84 on Ni-plated layer 82 and Au film 86 on Pd film 84.

Figure 8:
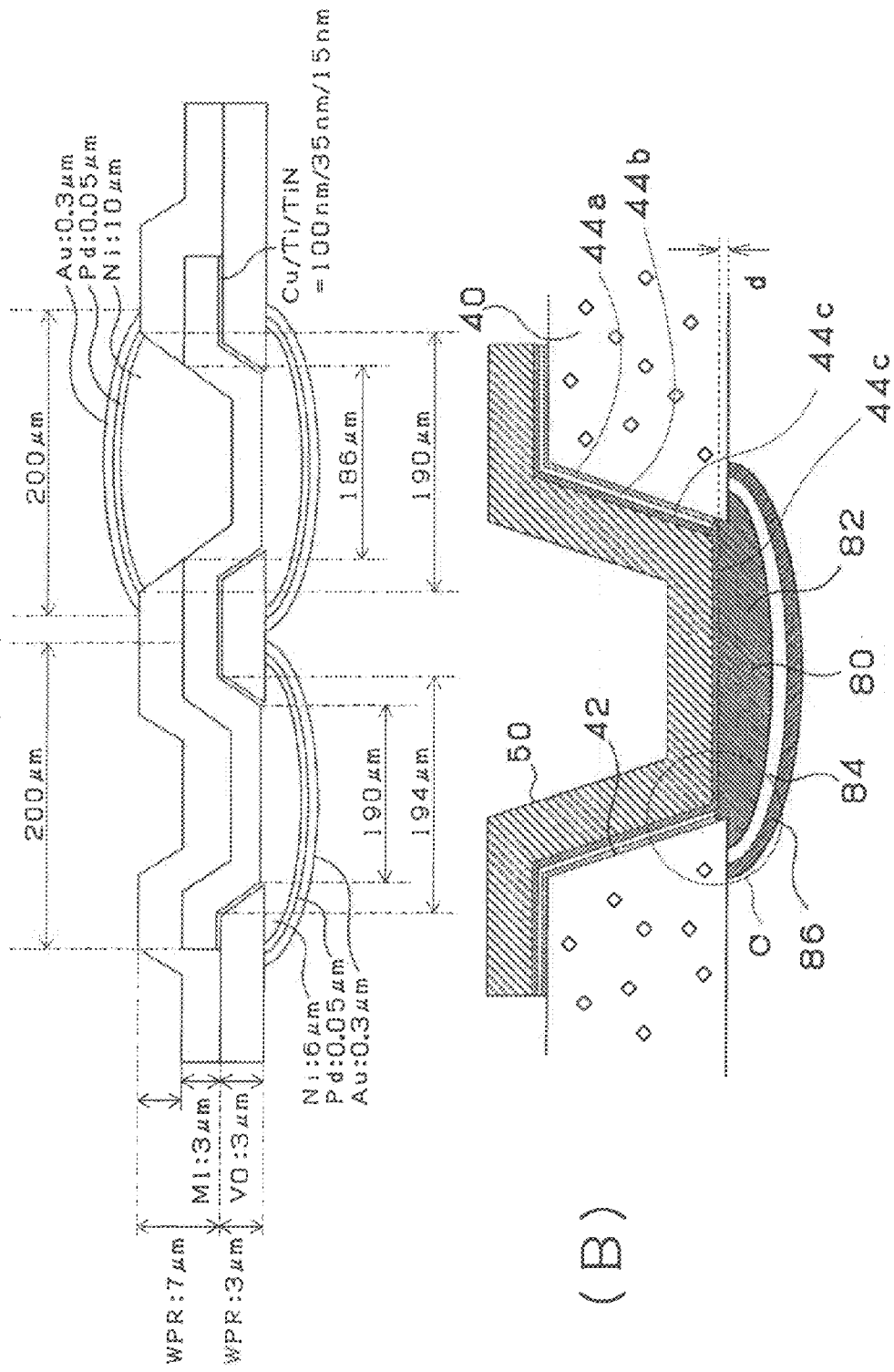
FIG. 8 are views to illustrate a via conductor of a printed wiring board according to the first embodiment.

The thickness of each layer is shown in FIG. 8A. The first interlayer resin insulation layer and the second interlayer resin insulation layer are formed to be approximately 3 μm thick. The Ni-plated layer forming surface-treatment coating 70 is formed to be approximately 10 μm thick. The Pd film on the Ni-plated layer is formed to be approximately 0.05 μm, and the Au film on the Pd film approximately 0.3 μm. Meanwhile, the Cu-sputtered film formed on the side wall of the via-conductor opening is formed to be approximately 100 nm, Ti-sputtered film approximately 35 nm, and TiN-sputtered film approximately 15 nm. The Ni-sputtered layer forming surface-treatment film 80 is formed to be approximately 6 μm, the Pb layer approximately 0.05 μm and the Au layer approximately 0.3 μm.

As described above, Ti-sputtered film (44b) and TiN-sputtered film (44a) are removed from the bottom-surface side of via conductor 50, and the surface of Cu-sputtered film (44c) is recessed by distance (d) (Ti-sputtered film: 35 nm+TiN-sputtered film: 15 nm=50 nm) from the second surface of first interlayer resin insulation layer 40 (see FIG. 8B).

In a printed wiring board according to the first embodiment, since the bottom surface of via conductor 50 is recessed 50 nm from the bottom surface of first interlayer resin insulation layer 40, an anchoring effect is achieved with surface-treatment coating 80 formed on via conductor 50, and adhesiveness is improved between via conductor 50 and surface-treatment coating 80. Also, in the area shown by circle "C" in FIG. 8B, Ti-sputtered film (44b) and TiN-sputtered film (44a) are removed up to their interior portion between opening 42 and Cu-sputtered film (44c), and Ni-plated layer 82 of surface-treatment coating 80 enters the space formed by such removal. Accordingly, adhesiveness may be improved between via conductor 50 and surface-treatment coating 80.

Here, when the base (on the first-surface side of via conductor 50) for forming surface-treatment coating 80 is a sputtered film, such a film will show barrier functions because of its fine crystallization, and suppress copper ions forming the via conductor from being diffused into surface-treatment coating 80. Thus, the adhesive strength of surface-treatment coating 80 is ensured. However, even if surface-treatment coating 80 formed by electrolytic plating is made from the same metal as the sputtered film (Cu-sputtered film (44c)), their crystallization structures are different. In addition, since a sputtered film (Cu-sputtered film (44c)) has a flat surface compared with a plated-metal film, surface-treatment coating 80 may possibly be removed from via conductor 50, for example, at the time of wire bonding or when heat is generated in the module. Therefore, in the present embodiment, the first-surface side of via conductor 50 is recessed from the second surface of first interlayer resin insulation layer 40. Accordingly, even if the base (on the first-surface side of via conductor 50) for forming surface-treatment coating 80 is a sputtered film, adhesiveness may be ensured between via conductor 50 and surface-treatment coating 80.

In the following, a method is described for manufacturing a printed wiring board according to the first embodiment.

Figure 3:
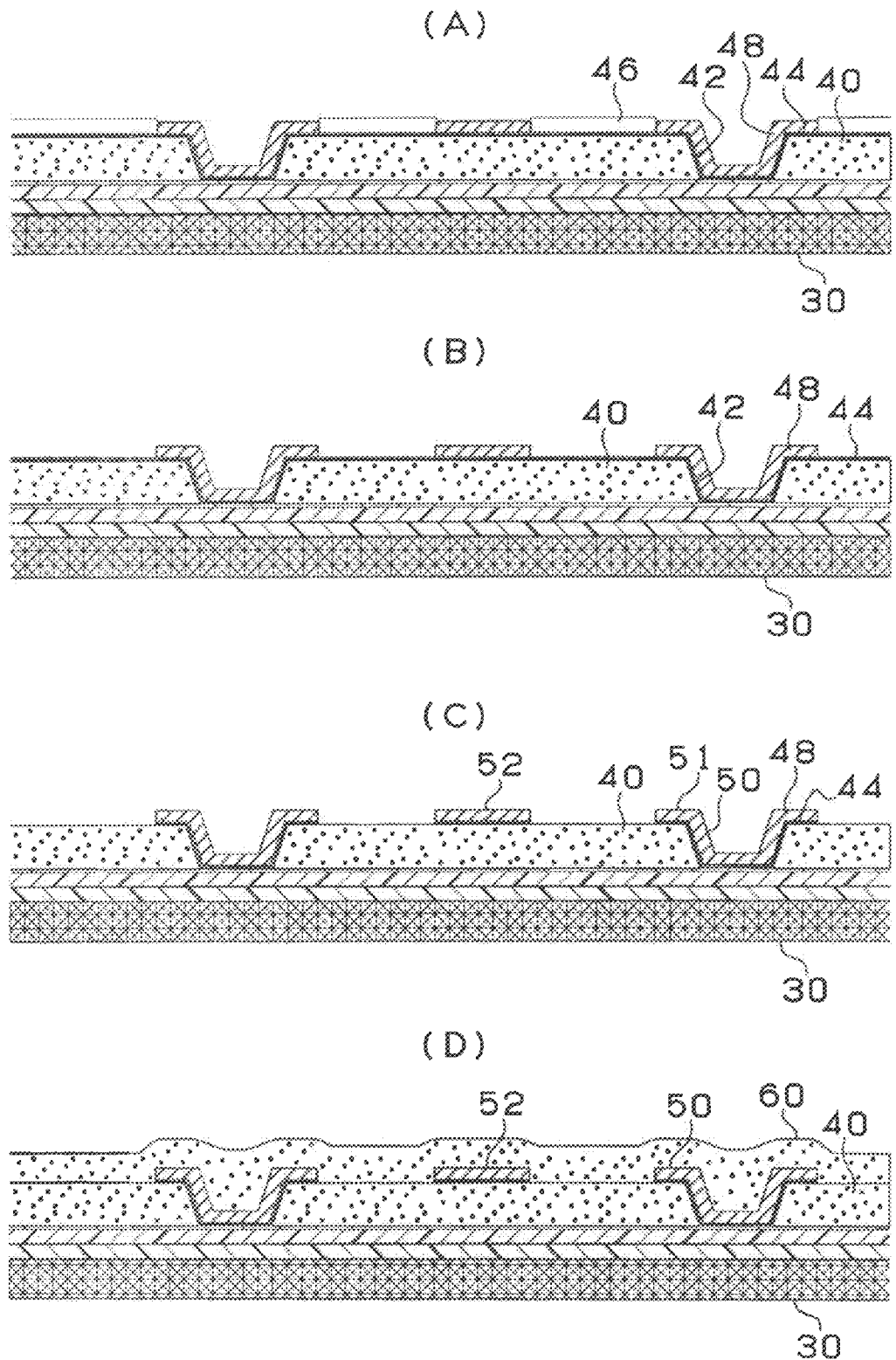
FIG. 3 are views of the steps for manufacturing a printed wiring board according to the first embodiment.
Figure 4:
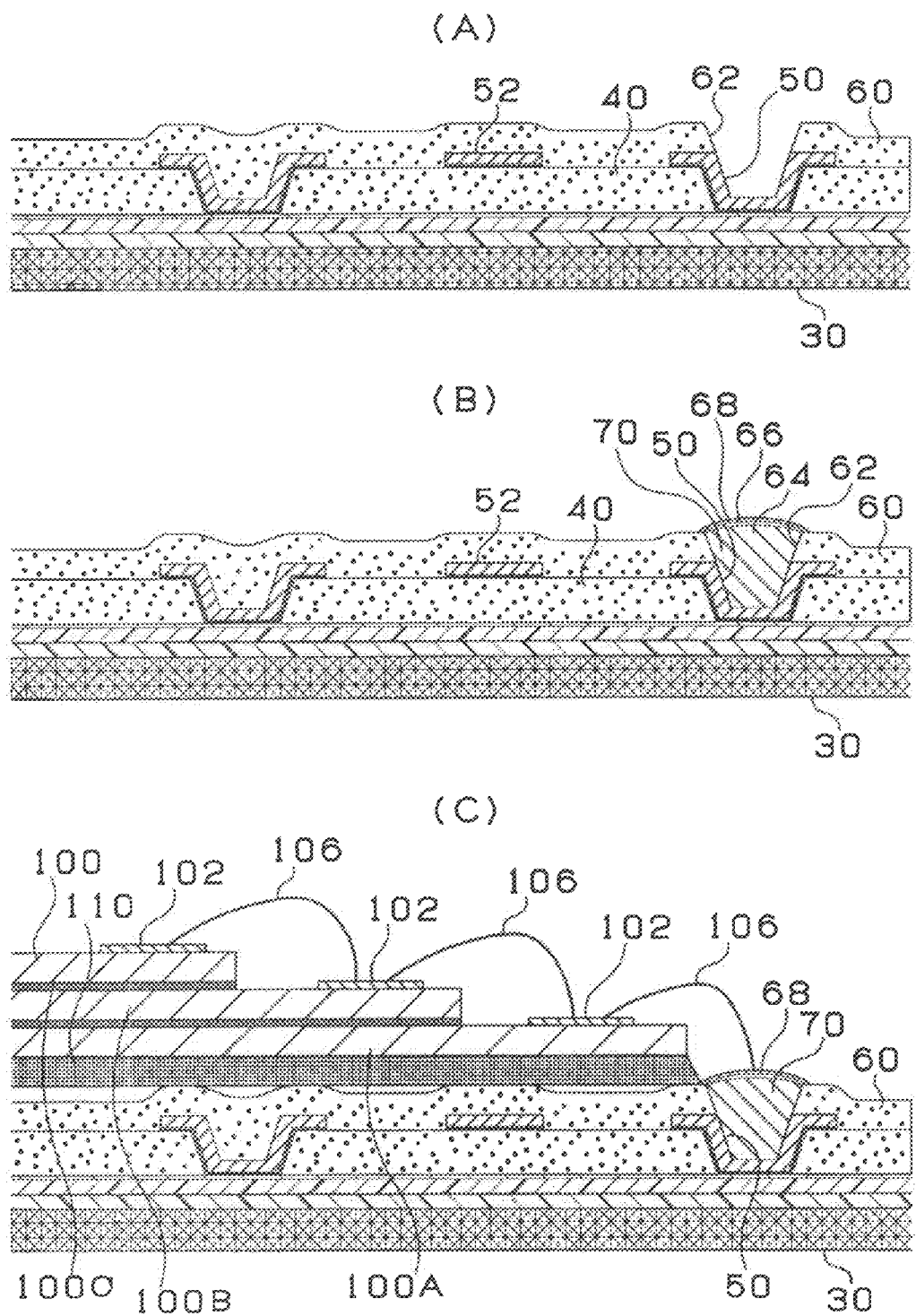
FIG. 4 are views of the steps for manufacturing a printed wiring board according to the first embodiment.
Figure 5:
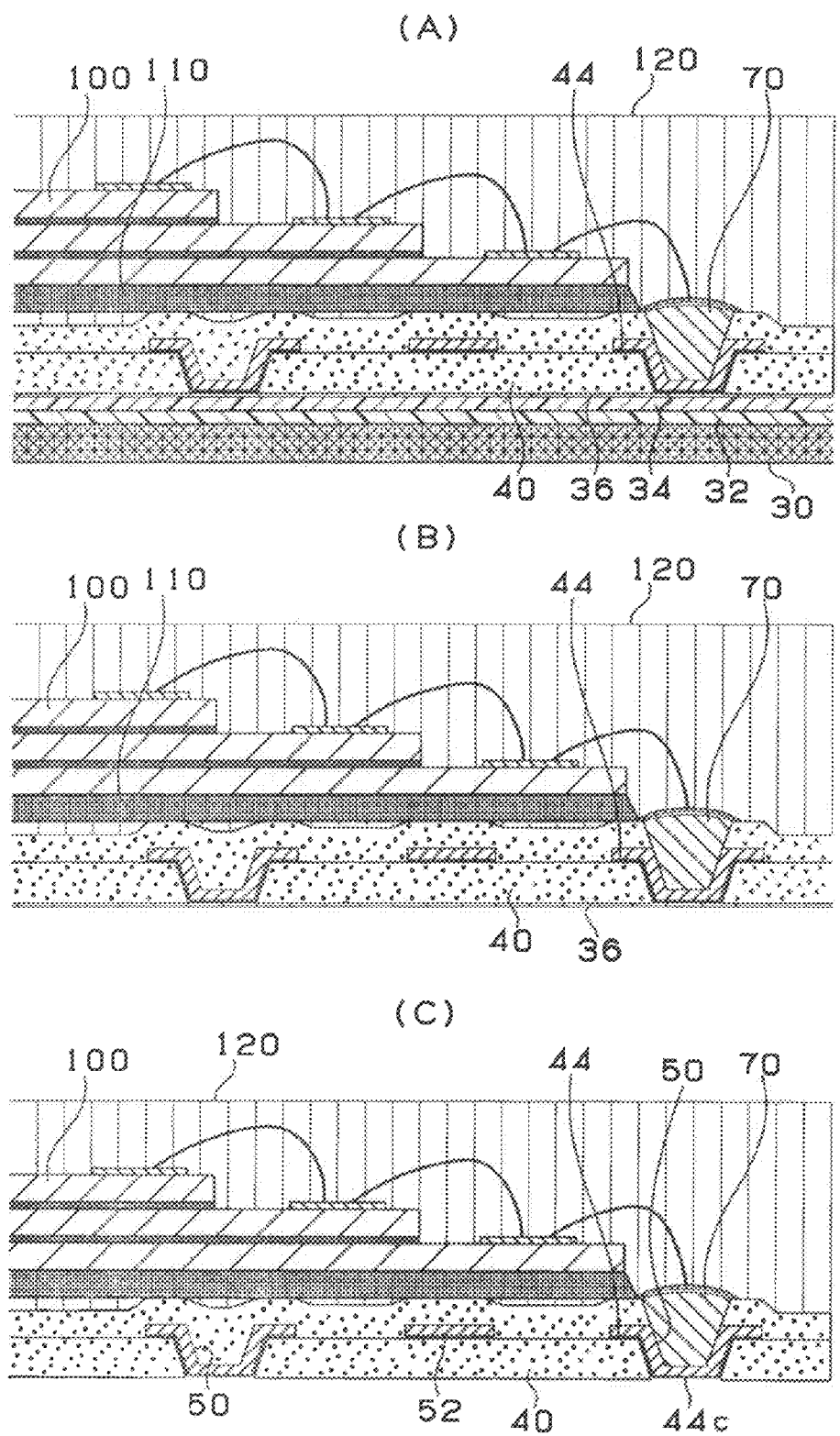
FIG. 5 are views of the steps for manufacturing a printed wiring board according to the first embodiment.

First, on support substrate 30 shown in FIG. 1A, 3 μm-thick thermoplastic resin (HT250, made by Nissan Chemical Industries, Ltd.) 32 is laminated (FIG. 1B). Then, 4 μm-thick buffer layer (brand name: WPR, made by JSR Corp.) 34 is formed (FIG. 1C). On buffer layer 34, stopper metal layer 36 made of TiN is formed by sputtering (FIG. 1D).

On TiN stopper-metal layer 36, 4 μm-thick interlayer resin insulation layer (brand name: WPR, made by JSR Corp.) 40 is laminated (FIG. 2A). Using a photolithographic technique, via opening 42 with an approximate diameter of 200 μm is formed at a predetermined spot (FIG. 2B). On the surface of interlayer resin insulation layer 40, including the interior of via opening 42, three-layer shield layer 44 is formed by sputtering (FIG. 2C). The structure of such a shield layer is described in further detail by referring to a magnified view of opening 42 in FIG. 7A. Shield layer 44 is made of TiN-sputtered film (44a), Ti-sputtered film (44b) and Cu-sputtered film (44c). Since TiN-sputtered film (44a), Ti-sputtered film (44b) and Cu-sputtered film (44c) are formed by sputtering, they are each flat and thin, and are highly adhesive to each other.

By applying a commercially available resist on interlayer resin insulation layer 40 coated with shield layer 44, then by conducting exposure/development, plating resist 46 with a predetermined pattern is formed (FIG. 2D). Then, by performing electrolytic plating, electrolytic copper-plated film 48 is formed on areas where the plating resist is not formed (FIG. 3A). Here, since electrolytic copper-plated film 48 is formed on Cu-sputtered film (44c) using copper as well, adhesiveness is high between shield layer 44 and electrolytic copper-plated film 48. By removing the plating resist (FIG. 3B), and by removing shield layer 44 under the plating resist using quick etching, via conductor 50 is formed in opening 42, and conductive circuit 52 and via land 51 are formed on interlayer resin insulation layer 40 (FIG. 3C). When forming two or more wiring layers, via conductor 50 is preferred to be a filled via.

On first interlayer resin insulation layer 40 with conductive circuit 52, 4 μm-thick interlayer resin insulation layer (brand name: WPR, made by JSR Corp.) 60 is laminated (FIG. 3D). Using a photolithographic technique, opening 62 with a diameter of 200 μM is formed on a predetermined via conductor (FIG. 4A). Then, on via conductor 50 exposed through opening 62, Ni-plated layer 64, Pd-plated layer 66 and Au-plated layer 68 are formed in that order by electroless plating (FIG. 4B).

On interlayer resin insulation layer 60, memory laminate 100 made by laminating memories (100A, 100B, 100C) is mounted by means of adhesive layer 110, and pad 102 of memory laminate 100 and surface-treatment coating 70 (via conductor 50) are connected using wire 106 (FIG. 4C).

Interlayer resin insulation layer 60 and memory laminate 100 are encapsulated by molding resin 120 (FIG. 5A). After that, heat is added and support substrate 30 is removed by sliding it using thermoplastic resin 32. Then, buffer layer 34 is removed by aching (FIG. 5B). FIG. 7B shows a magnified view of via conductor 50 after buffer layer 34 is removed. Etching is conducted using an etchant containing KOH to remove TiN stopper metal layer 36, Ti-sputtered film (44b) and TiN-sputtered film (44a) exposed through opening 42 in interlayer resin insulation layer 40 (FIG. 5C). Here, Ti is easy to dissolve by KOH, but Cu is difficult to dissolve. FIG. 7C shows a magnified view of via conductor 50 after TiN stopper metal layer 36, Ti-sputtered film (44b) and TiN-sputtered film (44a) exposed through opening 42 are removed. As described above by referring to FIG. 8B, the surface of Cu-sputtered film (44c) is recessed from the second surface of first interlayer resin insulation layer 40 by distance (d) (Ti-sputtered film: 35 nm+TiN-sputtered film: 15 nm=50 nm). Also, Ti-sputtered film (44b) and TiN-sputtered film (44a) are removed up to the interior portion between the side wall of opening 42 and Cu-sputtered film (44c).

Then, after forming Ni-plated layer 82 by electroless plating on Cu-sputtered film (44c) on the bottom of via conductor 50, Pb layer 84 and Au layer 86 are formed in that order by electroless plating, and surface-treatment coating 80 is formed (FIG. 6). FIG. 7D shows a magnified view of surface-treatment coating 80 in FIG. 6.

A semiconductor apparatus manufactured as above is mounted on a motherboard by means of wires or solder bumps. Here, a multiple number of such semiconductor apparatuses may be laminated and then mounted on a motherboard. In doing so, for example, when mounting 16-tiered memories on a motherboard, it becomes feasible to use only good semiconductor apparatuses obtained by mounting 4-tiered memories on a printed wiring board as above, and productivity will increase.

Second Embodiment

A printed wiring board according to the second embodiment of the present invention and a method for manufacturing such a printed wiring board are described.

In the present embodiment, stopper metal layer 36 in the first embodiment is omitted. In such a case, interlayer resin insulation layer 40 is directly formed on removable layer (thermoplastic resin) 32. Then, after support substrate 30 is peeled off and thermoplastic resin 32 is removed, Ti-sputtered film (44b) and TiN-sputtered film (44a) exposed through opening 42 in interlayer resin insulation layer 40 are removed.

Third Embodiment

A printed wiring board according to the third embodiment of the present invention and a method for manufacturing such a printed wiring board are described with reference to FIGS. 9-11.

Figure 10:
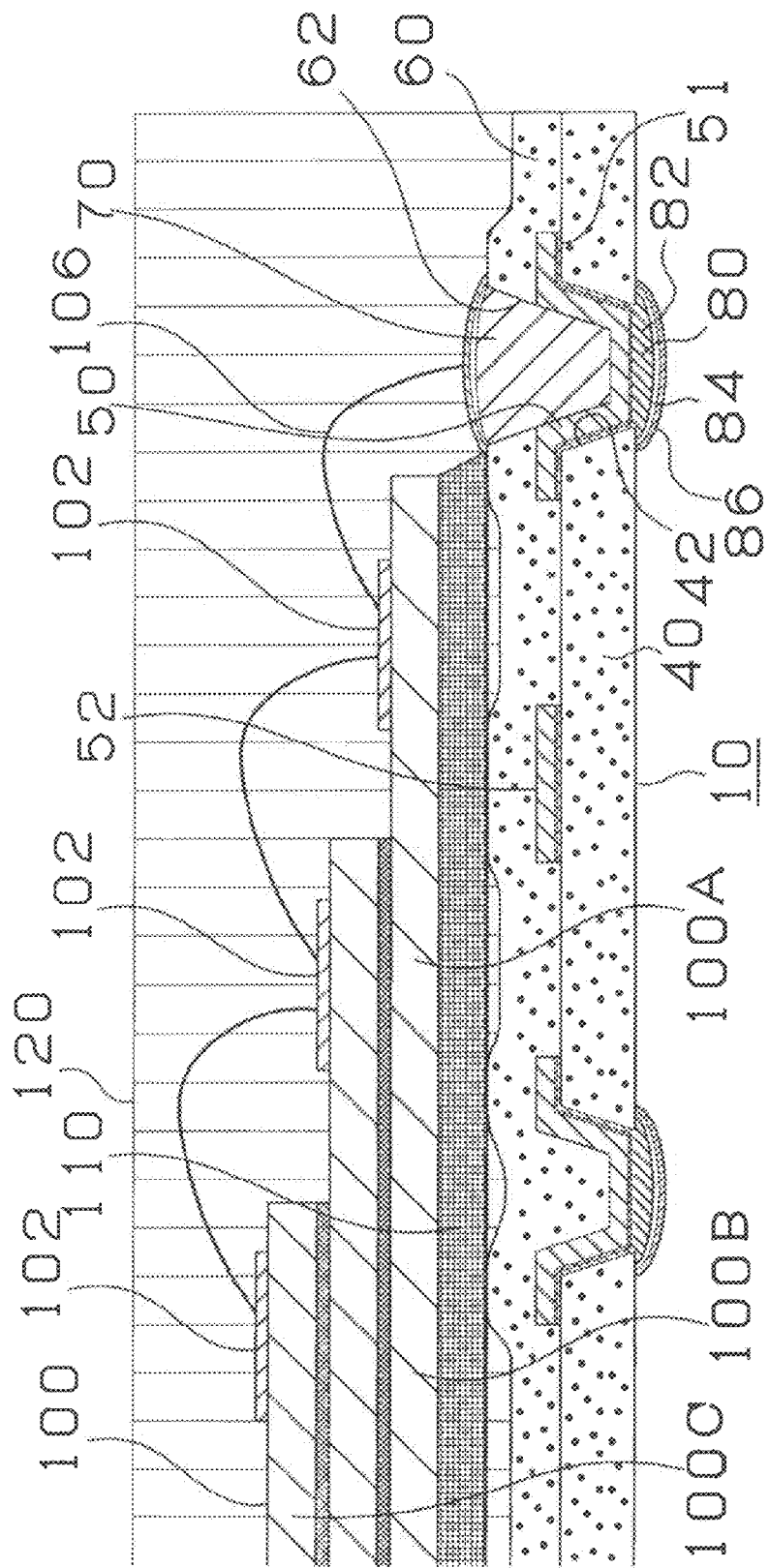
FIG. 10 is a cross-sectional view showing a printed wiring board of the second embodiment.
Figure 11:
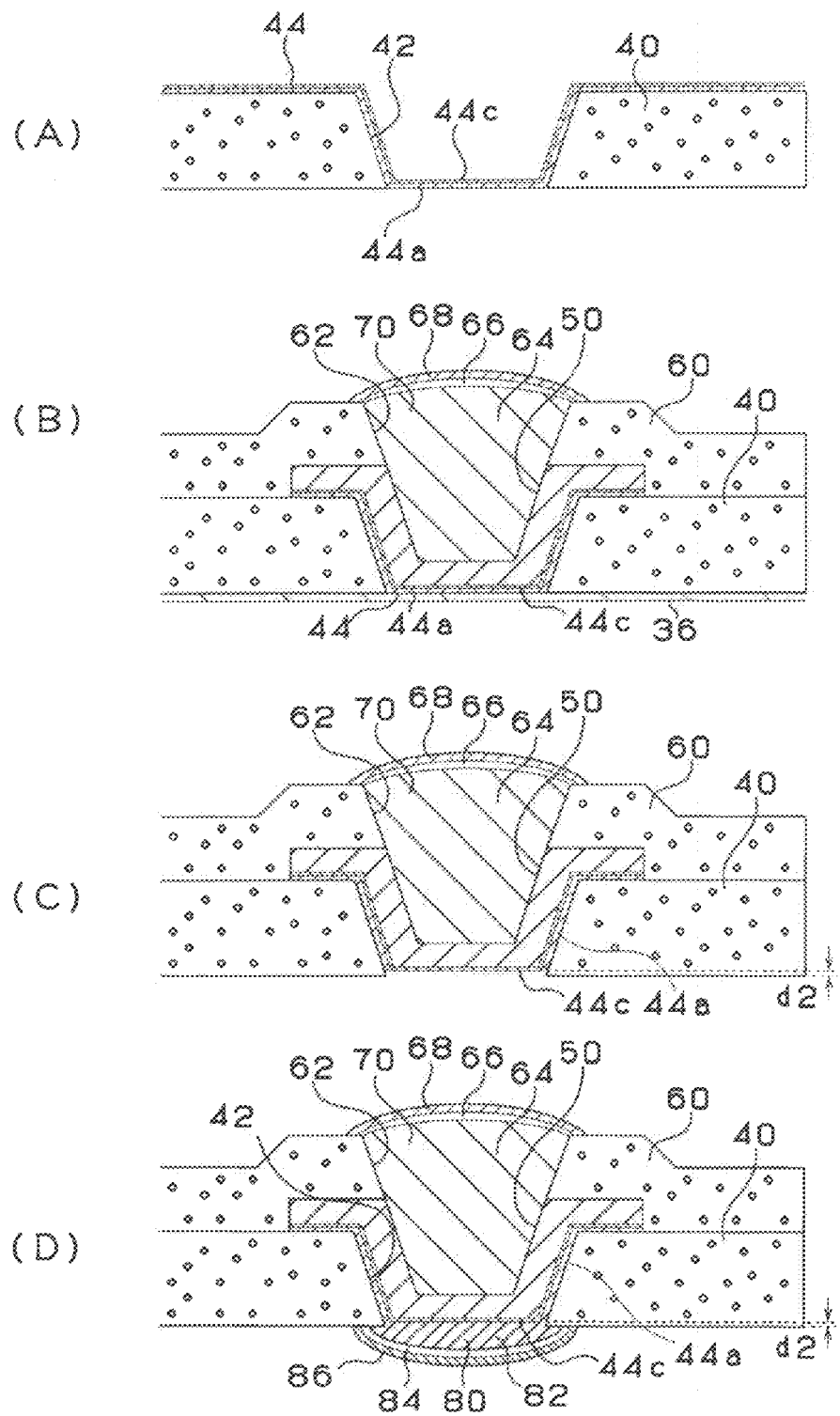
FIG. 11 are views of the steps for manufacturing a printed wiring board according to the second embodiment, showing a magnified via conductor and bump.

FIG. 10 is a cross-sectional view showing part of printed wiring board 10. Printed wiring board 10 of the third embodiment is structured the same as in the first embodiment described above by referring to FIG. 6. However, in the first embodiment, three layers, Cu-sputtered film (44c), Ti-sputtered film (44b) and TiN-sputtered film (44a), were formed on the side wall of opening 42 in interlayer resin insulation layer 40. By contrast, in the second embodiment, as shown in FIG. 11D which is a magnified view of via conductor 50 in FIG. 10, a two-layer structure is employed where two layers made of TiN-sputtered film (44a) (first conductive layer) and Cu-sputtered film (44c) (second conductive layer) are formed on the side wall of opening 42.

In a printed wiring board of the third embodiment, the bottom surface of via conductor 50 is recessed from the second surface of first interlayer resin insulation layer 40 by 50 nm (d2), which is the thickness of removed TiN-sputtered film (44a). Thus, an anchoring effect is achieved with surface-treatment coating 80 formed on via conductor 50, and adhesiveness is improved between via conductor 50 and surface-treatment coating 80. In addition, between the side wall of opening 42 and Cu-sputtered film (44c), TiN-sputtered film (44a) is removed up to its interior portion, and Ni-sputtered layer 82 of surface-treatment coating 80 enters the space formed by such removal. Accordingly, adhesiveness is enhanced between via conductor 50 and surface-treatment coating 80.

In the following, a method for manufacturing a printed wiring board of the third embodiment is described.

As described above by referring to FIGS. 1-2A, thermoplastic resin, buffer layer 34 and TiN stopper metal layer 36 are formed on silicon substrate 30, and interlayer resin insulation layer 40 is laminated on TiN stopper metal layer 36 (FIG. 9A). Via opening 42 with a diameter of 200 μm is formed at a predetermined spot (FIG. 9B). Two-layer shield layer 44 is formed by sputtering on the surface of interlayer resin insulation layer 40, including the interior of via opening 42 (FIG. 9C). The structure of such a shield layer is described in further detail by referring to a magnified view of opening 42 shown in FIG. 11A. Shield layer 40 is made of TiN sputtered film (44a) and Cu-sputtered film (44c).

In the following, a printed wiring board is formed the same as in the first embodiment described above by referring to FIGS. 2D-5B, and interlayer resin insulation layer 60 and memory laminate 100 are encapsulated by molding resin 120. After that, heat is added and silicon substrate 30 is removed using thermoplastic resin 32, and then buffer layer 34 is removed by ashing. FIG. 11B shows a magnified view of via conductor 50 after buffer layer 34 is removed. Etching is conducted using KOH to remove TiN stopper metal layer 36 and TiN-sputtered film (44a) exposed through opening 42 in interlayer resin insulation layer 40 (FIG. 11C). The surface of Cu-sputtered film (44c) is recessed from the lower surface of first interlayer resin insulation layer by distance (d2) (the thickness of TiN-sputtered film: 50 nm). Also, between the side wall of opening 42 and Cu-sputtered film (44c), Ti-sputtered film (44b) is removed up to its interior portion.

Then, Ni-sputtered layer 82 is formed by sputtering on Cu-sputtered film (44c) on the bottom of via conductor 50. After that, by coating Pb layer 84 and Au layer 86 through electroless plating, surface-treatment coating 80 is formed, made of Ni-sputtered layer 82, Pb layer 84 and Au layer 86 (FIG. 10). FIG. 11D shows a magnified view of surface-treatment coating 80 in FIG. 10.

Fourth Embodiment

In the present embodiment, electroless copper-plated film is used as a first conductive layer. Namely, via conductor 50 is made of electroless copper-plated film formed on the side wall of interlayer insulation layer 40, and of electrolytic plated-metal film filled in opening 42. In such a case, the bottom-surface side (first-surface side) of the via conductor is recessed from the second surface of first interlayer resin insulation layer 40 by the thickness of the electroless copper-plated film. A method of spraying an etchant is thought to be used when removing the electroless copper-plated film on the bottom-surface side (first-surface side) of the via conductor, for example. However, such a removal method is not limited specifically. In the present embodiment, the same functions and effects as in the first embodiment can be achieved.

A printed wiring board may have the following: an interlayer resin insulation layer with a first surface and a second surface opposite the first surface, and having a penetrating hole for a via conductor; a conductive circuit formed on the first surface of the interlayer resin insulation layer; a via conductor connected to the conductive circuit and formed in the penetrating hole; and surface-treatment coating formed on a first surface of the via conductor exposed through the penetrating hole. In such a printed wiring board, the via conductor is made of a first conductive layer formed on a side wall of the penetrating hole and of a plated-metal layer filling the penetrating hole, and the first surface of the via conductor is recessed from the second surface of the interlayer resin insulation layer.

In the printed wiring board, since the first surface of a via conductor is recessed from the second surface of an interlayer resin insulation layer, an anchoring effect is achieved with a surface-treatment coating formed on the second surface of the via conductor, and adhesiveness is improved between the via conductor and the surface-treatment coating.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board comprising:
    an interlayer resin insulation layer having a first surface and a second surface on an opposite side of the first surface, the interlayer resin insulation layer having a penetrating hole;
    a conductive circuit formed on the first surface of the interlayer resin insulation layer;
    a via conductor formed in the penetrating hole and connected to the conductive circuit on the first surface of the interlayer resin insulation layer; and
    a surface-treatment coating formed on a surface of the via conductor exposed from the second surface of the interlayer resin insulation layer through the penetrating hole, wherein the via conductor comprises a first conductive layer formed on a side wall of the penetrating hole and a plated-metal filling the penetrating hole, the surface of the via conductor is located inside the penetrating hole and recessed from the second surface of the interlayer resin insulation layer, the first conductive layer is formed on the side wall of the penetrating hole such that an end portion of the first conductive layer is located inside the penetrating hole and recessed from the surface of the via conductor, the via conductor has a second conductive layer between the first conductive layer and the plated-metal, and the second conductive layer is formed in contact with the plated-metal and the surface-treatment coating.

2. The printed wiring board according to claim 1, wherein the second conductive layer and the plated-metal are made of the same metal.

3. The printed wiring board according to claim 1, wherein the second conductive layer and the plated-metal are made of copper.

4. The printed wiring board according to claim 1, wherein the first conductive layer has a thickness which is greater than a thickness of the second conductive layer.

5. The printed wiring board according to claim 1, wherein the first conductive layer and the second conductive layer are formed by sputtering.

6. The printed wiring board according to claim 1, wherein the surface-treatment coating is formed to coat a peripheral portion of the penetrating hole on the second surface of the interlayer resin insulation layer.

7. The printed wiring board according to claim 1, wherein the first conductive layer comprises a TiN film formed on the interlayer resin insulation layer and a Ti film on the TiN film.

8. The printed wiring board according to claim 1, wherein the first conductive layer comprises a TiN film formed on the interlayer resin insulation layer and a Ti film on the TiN film, the second conductive layer comprises a Cu-sputtered film, and the plated-metal comprises a copper-plated film.

9. The printed wiring board according to claim 1, wherein the surface-treatment coating comprises a Ni-plated layer on the surface of the via conductor, a Pd film on the Ni-plated layer and a Au film on the Pd film.

* * * * *